United States Patent
Cheng et al.

(10) Patent No.: US 9,362,179 B1
(45) Date of Patent: Jun. 7, 2016

(54) METHOD TO FORM DUAL CHANNEL SEMICONDUCTOR MATERIAL FINS

(71) Applicant: International Business Machines Corporation, Armonk, NY (US)

(72) Inventors: Kangguo Cheng, Schenectady, NY (US); Ryan O. Jung, Rensselaer, NY (US); Fee Li Lie, Albany, NY (US); Eric R. Miller, Albany, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/746,223

(22) Filed: Jun. 22, 2015

(51) Int. Cl.
| | |
|---|---|
| *H01L 21/8238* | (2006.01) |
| *H01L 21/322* | (2006.01) |
| *H01L 21/308* | (2006.01) |
| *H01L 29/66* | (2006.01) |
| *H01L 29/78* | (2006.01) |
| *H01L 27/092* | (2006.01) |
| *H01L 29/161* | (2006.01) |

(52) U.S. Cl.
CPC .... *H01L 21/823821* (2013.01); *H01L 21/3081* (2013.01); *H01L 21/3225* (2013.01); *H01L 27/0924* (2013.01); *H01L 29/161* (2013.01); *H01L 29/66795* (2013.01); *H01L 29/785* (2013.01)

(58) Field of Classification Search
CPC .................. H01L 21/823821; H01L 29/785; H01L 27/0924; H01L 29/66795
See application file for complete search history.

(56) References Cited

U.S. PATENT DOCUMENTS

| | | | |
|---|---|---|---|
| 8,263,462 B2 * | 9/2012 | Hung | ................ H01L 29/66795 257/288 |
| 2012/0319178 A1 | 12/2012 | Chang et al. | |
| 2014/0197377 A1 | 7/2014 | Kim et al. | |
| 2014/0264601 A1 | 9/2014 | Basker et al. | |

* cited by examiner

*Primary Examiner* — David Vu
(74) *Attorney, Agent, or Firm* — Scully, Scott, Murphy & Presser, P.C.; Steven J. Meyers

(57) ABSTRACT

A silicon fin precursor is formed in an nFET device region and a fin stack comprising alternating material portions, and from bottom to top, of silicon and a silicon germanium alloy is formed in a pFET device region. A thermal anneal is then used to convert the fin stack into a silicon germanium alloy fin precursor. A thermal oxidation process follows that converts the silicon fin precursor into a silicon fin and the silicon germanium alloy fin precursor into a silicon germanium alloy fin. Functional gate structures can be formed straddling over each of the various fins.

14 Claims, 4 Drawing Sheets

METHOD TO FORM DUAL CHANNEL SEMICONDUCTOR MATERIAL FINS

BACKGROUND

The present application relates to a semiconductor structure and a method of forming the same. More particularly, the present application relates to a method of forming dual channel complementary metal oxide semiconductor (CMOS) fin field effect transistors (i.e., finFETs). The present application also relates to a semiconductor structure that can be formed by the method.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high-mobility channels.

Dual channel CMOS having different semiconductor channel materials is needed for 10 nm and beyond technologies. For example, silicon (Si) fins are needed for nFinFET devices, while silicon germanium alloy (SiGe) fins are needed for pFinFET devices. Due to the material property difference, processing semiconductor fins having different channel mobility still has some unique challenges. For example, Si and SiGe have different etch rates which can result in Si fins and SiGe fins that have completely different critical dimensions including, for example, different fin widths. Different fin widths can cause unwanted process, device, and design complexities.

In view of above, there is a need to provide a method for forming dual channel CMOS FinFETs in which the Si fins and the SiGe fins have the same width and the same critical dimension.

SUMMARY

The present application provides a method for forming CMOS finFET having silicon fins and silicon germanium alloy fins on a same substrate in which the Si fins and the SiGe fins have the same width and the same critical dimension. The method of the present application includes forming a silicon fin precursor in an nFET device region and a fin stack comprising alternating material portions, and from bottom to top, of silicon and a silicon germanium alloy in a pFET device region. A thermal anneal is then used to convert the fin stack into a silicon germanium alloy fin precursor. A thermal oxidation process follows that converts the silicon fin precursor into a silicon fin and the silicon germanium alloy fin precursor into a silicon germanium alloy fin. Functional gate structures can be formed straddling over each of the various fins.

In one aspect of the present application, a method of forming a semiconductor structure is provided. In one embodiment of the present application, the method includes forming a silicon fin precursor in an nFET device region of a substrate, and a fin stack comprising alternating material portions and, from bottom to top, of silicon and a silicon germanium alloy in a pFET device region of the substrate. A thermal anneal is then performed to convert the fin stack into a silicon germanium alloy fin precursor having a first germanium content. Next, a thermal oxidation is performed to convert the silicon fin precursor into a silicon fin, and to convert the silicon germanium alloy fin precursor into a silicon germanium alloy fin having a second germanium content that is greater than the first germanium content, wherein the silicon fin has a width that is less than a width of the silicon fin precursor and the silicon germanium alloy fin has a width less than a width of the silicon germanium alloy fin precursor.

In another aspect of the present application, a semiconductor structure is provided. In one embodiment of the present application, the semiconductor structure includes a silicon fin located directly on a first portion of a substrate, and a silicon germanium alloy fin located directly on a silicon pedestal structure that is present directly on a second portion of the substrate. In accordance with the present application, the silicon fin and the silicon germanium alloy fin have a same width and topmost surfaces that are coplanar with each other.

DETAILED DESCRIPTION

Figure 1:
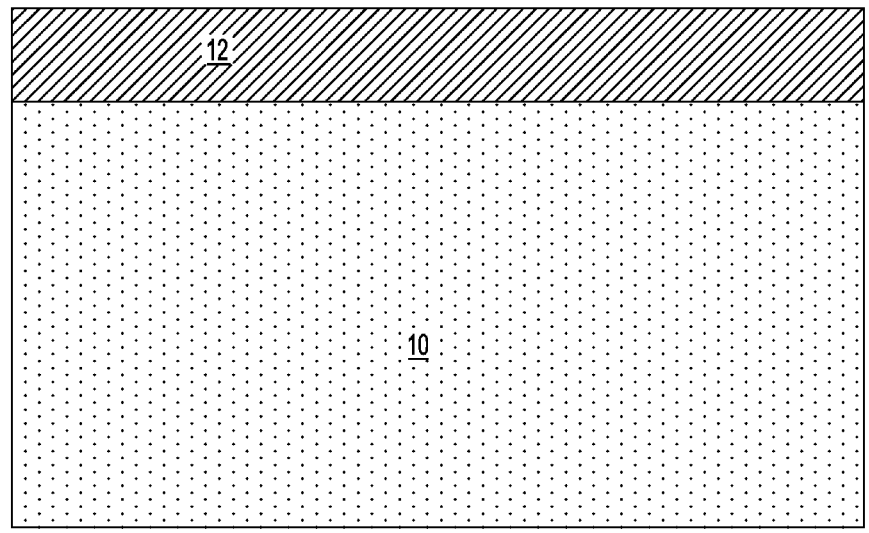
FIG. 1 is a cross sectional view of an exemplary semiconductor structure including, from bottom to top, a silicon base layer and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a silicon base layer 10 and a hard mask layer 12 that can be employed in accordance with an embodiment of the present application. The hard mask layer 12 that can be employed is a contiguous layer that covers the entirety of the topmost surface of the silicon base layer 10.

The silicon base layer 10 that may be used in the present application is typically single crystalline silicon. In some embodiments of the present application, the silicon base layer 10 that can be used may be a bulk silicon substrate. In other embodiments of the present application, the silicon base layer 10 is an uppermost semiconductor material layer of a semiconductor-on-insulator (SOI) substrate. The SOI substrate would further including an insulator layer, such an oxide and/or nitride, beneath the silicon base layer 10. In some embodiments, a handle substrate may be located beneath the insulator layer. The handle substrate may be any well known semiconductor material such as silicon.

In some embodiments of the present application, the silicon base layer 10 that may be used in the present application is non-doped (i.e., intrinsic silicon). In other embodiments, the silicon base layer 10 may be doped with an n-type or p-type dopant. The term "p-type" refers to the addition of impurities to an intrinsic semiconductor that creates deficiencies of valence electrons. For silicon base layer 10, examples of p-type dopants, i.e., impurities, include, but are not limited to, boron, aluminum, gallium and indium. "N-type" refers to the addition of impurities that contributes free electrons to an intrinsic semiconductor. For silicon base layer 10, examples of n-type dopants, i.e., impurities, include, but are not limited to, antimony, arsenic and phosphorous.

The hard mask layer 12 that can be employed in the present application may include a hard mask material such as, for example, a semiconductor oxide, a semiconductor nitride and/or a semiconductor oxynitride. In one embodiment, the hard mask material that can be used in providing the hard mask layer 12 can be comprised of silicon dioxide. In another embodiment, the hard mask material that can be used in providing the hard mask layer 12 can be comprised of silicon nitride. In yet another embodiment, the hard mask material that can be used in providing the hard mask layer 12 can be a stack comprised of, in any order, silicon dioxide and silicon nitride.

In some embodiments of the present application, the hard mask material that can be used in providing the hard mask layer 12 can be formed by a deposition process such as, for example, chemical vapor deposition (CVD) or plasma enhanced chemical vapor deposition (PECVD). In other embodiments, the hard mask material that can be used in providing the hard mask layer 12 can be formed by a thermal process such as, for example, thermal oxidation and/or thermal nitridation. In yet other embodiments, the hard mask material that can be used in providing the hard mask layer 12 can be formed by a combination of a deposition process and a thermal process. The thickness of the hard mask material that can be used in providing the hard mask layer 12 can range from 2 nm to 10 nm, although other thickness that are lesser than, or greater than, the aforementioned thickness range can be used for the hard mask layer 12.

Figure 2:
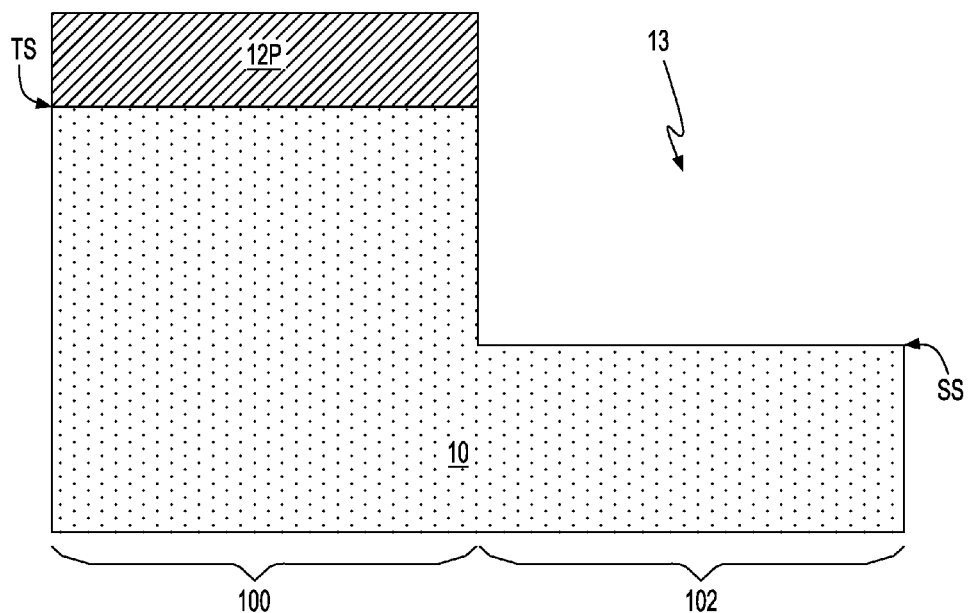
FIG. 2 is a cross sectional view of the exemplary semiconductor structure of FIG. 1 after removing the hard mask layer and a portion of the silicon base layer from a pFET device region of the exemplary semiconductor structure.

Referring now to FIG. 2, there is illustrated the exemplary semiconductor structure of FIG. 1 after removing the hard mask layer 12 and a portion of the silicon base layer 10 from a pFET device region 102 of the exemplary semiconductor structure. The removal of the hard mask layer 12 and a portion of the silicon base layer 10 provides opening 13 that exposes a sub-surface, SS, of the silicon base layer 10. By "sub-surface" it is meant a surface of the silicon base layer 10 that is located between the topmost surface, TS, of the silicon base layer 10 and a bottommost surface (not specifically labeled) of the silicon base layer 10. A portion of the hard mask layer 12 remains atop the topmost surface, TS, of the silicon base layer 10 in an nFET device region 100 of the exemplary semiconductor structure. The remaining hard mask layer 12 within the nFET device region 100 can be referred to herein as a hard mask layer portion 12P.

The exemplary semiconductor structure illustrated in FIG. 2 can be formed by lithography and etching. Lithography includes forming a photoresist material (not shown) on a topmost surface of the hard mask layer 12. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the hard mask layer 12. The pattern provided by the patterned photoresist material is thereafter transferred into the underlying material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The patterned resist material can be removed any time after the initial pattern has been transferred into at least the hard mask layer 12 utilizing any conventional resist stripping process such as, for example, ashing.

Figure 3:
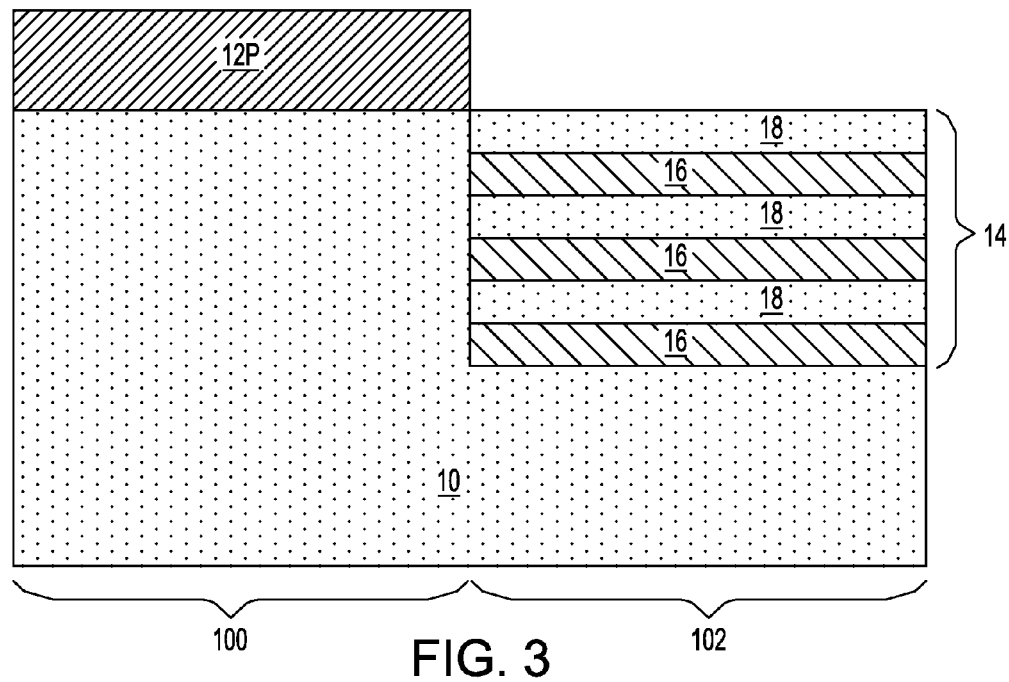
FIG. 3 is a cross sectional view of the exemplary semiconductor structure of FIG. 2 after forming a material stack comprising alternating layers, and from bottom to top, of a silicon germanium alloy material and a silicon material on an exposed sub-surface of the silicon base layer within the pFET device region.

Referring now to FIG. 3, there is illustrated the exemplary semiconductor structure of FIG. 2 after forming a material stack 14 comprising alternating layers, and from bottom to top, of a silicon germanium alloy material 16 and a silicon material 18 on the exposed sub-surface, SS, of the silicon base layer 10 within the pFET device region 102. Material stack 14 does not form within the nFET device region 100 because of the presence of the hard mask layer portion 12P. In some embodiments, a dielectric spacer (not shown) can be formed on the exposed sidewall surface of the non-etched silicon base layer 10 and within opening 13 prior to forming the material stack 14. When present, the dielectric spacer may comprise a dielectric material such as, for example, silicon dioxide or silicon nitride. The dielectric spacer can be formed by deposition of a dielectric material, followed by a spacer etch.

The material stack 14 that is formed in the present application includes at least one layer that include a silicon germanium alloy material 16 and at least one layer of a silicon material 18. The number of layers of silicon germanium alloy material 16 and the number of layers of silicon material 18 within material stack 14 may vary; the total number of layers of silicon germanium alloy material 16 and total number of layers of silicon material 18 determine the height of the subsequently formed silicon germanium alloy fin. In one example, three separate layers of the silicon germanium alloy material 16, and three separate layers of silicon material 18 are shown in FIG. 3. As is shown in the embodiment of the present application, each layer of the material stack 14 that includes silicon material 18 is formed on a silicon germanium alloy material 16. As is further shown, the topmost layer of silicon material 18 has a topmost surface that is coplanar with the original topmost surface of the silicon base layer that is still present in the nFET device region 100.

Each layer of the silicon germanium alloy material 16 of material stack 14 that is formed can have an initial germanium content of from 20 atomic % to 80 atomic % germanium. Other initial germanium contents that are lesser than, or greater than, the aforementioned range may also be used in the present application. In some embodiments of the present application, each layer of silicon germanium alloy material 16 within the material stack 14 has a same original content of germanium. In other embodiments of the present application, at least one layer of the silicon germanium alloy material 16 within the material stack 14 has a different initial germanium content from another layer of the silicon germanium alloy material 16 of the material stack 14. In one embodiment, each layer of silicon germanium alloy material 16 may have a uniform initial germanium content throughout an entirety of the layer. In another embodiment, each layer of silicon germanium alloy material 16 has a vertically graded initial germanium content. In yet a further embodiment, some of the layers of silicon germanium material 16 have a uniform initial germanium content, while other layers of silicon germanium material 16 have a vertically graded initial germanium content.

Each layer of silicon germanium alloy material 16 is formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, each silicon germanium alloy material 16 has an epitaxial relationship, i.e., same crystal orientation, as that of the underlying silicon material.

Examples of various epitaxial growth processes that are suitable for use in forming the silicon germanium alloy material 16 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of silicon germanium alloy material 16. In some embodiments, the source gas for the deposition of the silicon germanium alloy material 16 includes a mixture of a silicon containing gas source and a germanium containing gas source or a combined silicon and germanium source gas may be used. Carrier gases like hydrogen, nitrogen, helium and argon can be used.

The thickness of each layer of the silicon germanium alloy material 16 that can be formed in the present application is at, or below, the critical thickness of a silicon germanium alloy. Above the critical thickness, the silicon germanium alloy that is formed is very defective and is not suitable for use as a device channel material. In one example, the thickness of the silicon germanium alloy material 16 is from 30 nm to 100 nm. Other thicknesses that are lesser than, or greater than, the aforementioned thickness range can also be employed in the present application as long as the thickness is below the limit in which defects form. In some embodiments of the present application, each layer of silicon germanium alloy material 16 has a same thickness. In other embodiments, at least one layer of silicon germanium alloy material 16 has a thickness that differs from the thickness of another layer of silicon germanium alloy material 16.

Each layer of silicon material 18 of the material stack 14 shown in FIG. 3 can be formed utilizing one of the epitaxial growth or deposition processes mentioned above in forming the silicon germanium alloy material 16. Well known silicon source gases can be used in forming each layer of silicon material 18. Each layer of silicon material 18 may have a thickness that is in range from 5 nm to 20 nm. Other thicknesses that are lesser than, or greater than, the aforementioned thickness range may also be used for each layer of silicon material 18. In some embodiments, each layer of silicon material 18 within the material stack 14 has a same thickness. In other embodiments, at least one layer of silicon material 18 within the material stack 14 has a different thickness than another layer of silicon material 18 of the material stack 14.

Figure 4:
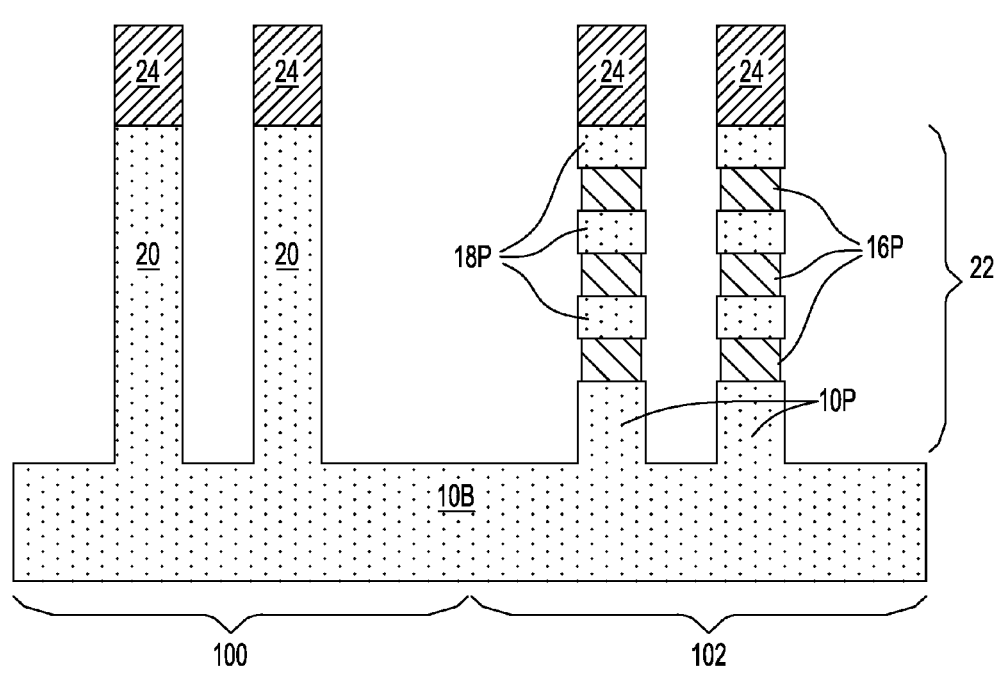
FIG. 4 is a cross sectional view of the exemplary semiconductor structure of FIG. 3 after forming a plurality of silicon fin precursors in an nFET device region and a plurality of fin stacks comprising alternating material portions, and from bottom to top, of silicon and a silicon germanium alloy in the pFET device region.

Referring now to FIG. 4, there is illustrated the exemplary semiconductor structure of FIG. 3 after forming a plurality of silicon fin precursors 20 in nFET device region 100 and a plurality of fin stacks 22 in pFET device region 102. Each silicon fin precursor 20 is formed from an upper portion of the silicon base layer 10 in the nFET device region 100. Each fin stack 22 comprises alternating material portions, and from bottom to top, of silicon (10P or 18P) and a silicon germanium alloy (16P) in the pFET device region 102. Element 10P represent a silicon pedestal that is formed from an upper portion of the silicon base layer 10 within the pFET device region 102 after performing a pattern transfer etch (see below) that defines the fin stack 22 in the pFET device region 102; the silicon pedestal 10P represents the bottommost silicon material portion of each fin stack 22. The term "fin precursor" is used throughout the present application to denote an initial fin structure that precedes, and is used in providing, a final fin structure. Typically, the fin precursor has a width that is greater than the width of the final fin structure and, when silicon germanium alloy fin precursors are formed, the silicon germanium alloy fin precursor has a lower germanium content than the final silicon germanium alloy fin.

Although a plurality of silicon fin precursors 20 and a plurality of fin stacks 22 are described and illustrated, the present application works when a single silicon fin precursor and/or a single fin stack is formed.

Prior to forming the silicon fin precursors 20 and the fin stacks 22, the hard mask layer portion 12P is removed from atop the silicon base layer 10. The hard mask layer portion 12P can be removed utilizing any well known material removal process including, for example, chemical mechanical polishing or etch back.

After removing the hard mask layer portion 12, another hard mask layer (not specifically shown) such as, for example, silicon dioxide and/or silicon nitride, may be formed prior to patterning. After patterning, a remaining portion of the another hard mask layer is present atop each silicon fin precursor 20 and each fin stack 22. The portion of the another hard mask layer that remains after patterning can be referred to herein as hard mask cap 24.

In one embodiment of the present application, the patterning process comprises a sidewall image transfer (SIT) process. The SIT process includes forming a contiguous mandrel material layer (not shown) over the topmost surface of the another hard mask layer. The contiguous mandrel material layer (not shown) can include any material (organic material, semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying materials to provide silicon fin precursors 20 in the nFET device region 100 and fin stacks 22 in the pFET device region 102. Each silicon fin precursor 20 and each fin stack 22 extends upward from a substrate. In the embodiment illustrated, substrate is a remaining portion of the silicon base layer 10. The remaining portion of the silicon base layer 10 is labeled as 10B in the drawings. In yet other embodiments, and when a SOI substrate is used, each silicon fin precursor 20 and each fin stack 22 extends upward from an insulator layer; in such an embodiment the insulator layer serves as a substrate in the present application. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. In some embodiments, a double SIT process can be used.

In another embodiment, the patterning process can include lithography and etching. Lithography includes forming a photoresist material (not shown) over the topmost surface another hard mask layer. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

Each silicon fin precursor 20 that is formed includes a pair of vertical sidewalls that are parallel to each other. As used herein, a surface is "vertical" if there exists a vertical plane from which the surface does not deviate by more than three times the root mean square roughness of the surface. Each fin stack 22 that is formed includes a pair sidewalls that are parallel to each other and wherein each silicon germanium alloy material portion 16P may have a thickness that is equal to, or less than, the thickness of each silicon material portion (10P and 16P). In FIG. 4, each silicon germanium alloy material portion 16P has a width that is less than the silicon material portion 18 and silicon pedestal 10P. It is again noted that silicon pedestal 10P forms the bottommost silicon material portion of each fin stack 22 during the pattern transfer etch mentioned above. Thus, the pattern transfer etch within the pFET device region 102 removes a remaining portion of the silicon base layer 10 that was located beneath the material stack 14 mentioned above.

Each silicon fin precursor 20 and each fin stack 22 has a same height. In one embodiment of the present application, each silicon fin precursor 20 and each fin stack 22 that is formed has a height from 10 nm to 100 nm. Each silicon fin precursor 20 and each fin stack 22 have a same first width. In one embodiment, each silicon fin precursor fin 20 and each fin stack 22 has a first width from 5 nm to 30 nm. Other heights and first widths that are lesser than, or greater than, the aforementioned ranges may also be used in the present application for each silicon fin precursor 20 and each fin stack 22.

In some embodiments of the present application, each silicon fin precursor 20 within the nFET device region 100 is separated from its nearest neighboring silicon fin precursor 20 by a pitch that is from 20 nm to 60 nm; the pitch can be measured from a central portion of one silicon fin precursor to a central portion of the nearest neighboring silicon fin precursor. In some embodiments of the present application, each fin stack 22 within the pFET device region 102 is separated from its nearest neighboring fin stack 22 by a pitch that is from 20 nm to 60 nm; the pitch can be measured from a central portion of one fin stack to a central portion of the nearest neighboring fin stack. Other pitches that are lesser than, or greater than, the aforementioned ranges may also be used for each silicon fin precursor 20 and each fin stack 22.

Figure 5:
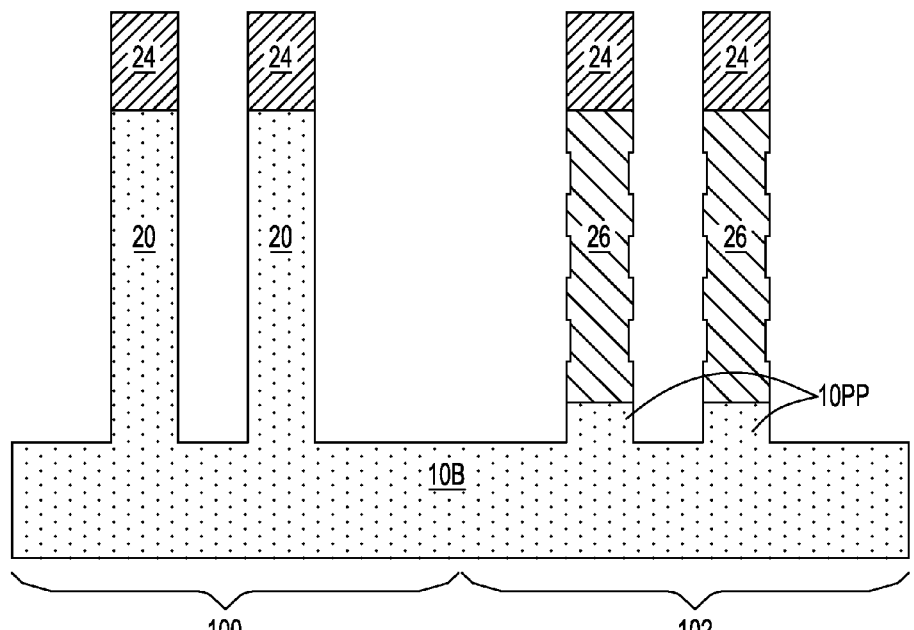
FIG. 5 is a cross sectional view of the exemplary semiconductor structure of FIG. 4 after performing a thermal anneal to convert each fin stack in the pFET device region into a silicon germanium alloy fin precursor having a first germanium content.

Referring now to FIG. 5, there is illustrated the exemplary semiconductor structure of FIG. 4 after performing a thermal anneal to convert each fin stack 22 in the pFET device region 102 into a silicon germanium alloy fin precursor 26 having a first germanium content. Each silicon germanium alloy fin precursor 26 may be present upon a remaining portion of silicon pedestal 10P. The remaining silicon pedestal can be referred to herein as a silicon pedestal portion 10PP. In some embodiments, the entirety of the silicon pedestal 10P may be converted into a silicon germanium alloy. Each silicon germanium alloy fin precursor 26 has sidewall surfaces that have a roughness that greater than a desired roughness for a silicon germanium alloy fin.

The thermal anneal that is used to covert each fin stack 22 into a silicon germanium alloy fin precursor 26 may be referred to as a thermal mixing process. During thermal annealing, Ge is diffused from the silicon germanium alloy material portions 16P into the silicon material portions (10P or 18P) forming the silicon germanium alloy fin precursor 26. The thermal anneal can be carried out in an inert ambient such as, for example, He, Ar and/or Ne. The thermal anneal can be performed at a temperature from 800° C. to 1350° C. The thermal anneal may include a furnace anneal, a rapid thermal anneal or any other anneal that can convert each fin stack 22 into a silicon germanium alloy fin precursor 26.

Each silicon germanium alloy fin precursor 26 that is formed at this point of the present application has the first width as mentioned above for the fin stack 22. Each silicon germanium alloy fin precursor 26 has a first germanium content that is less than the initial silicon germanium content of each layer of silicon germanium alloy material 16 that was previously formed.

Figure 6:
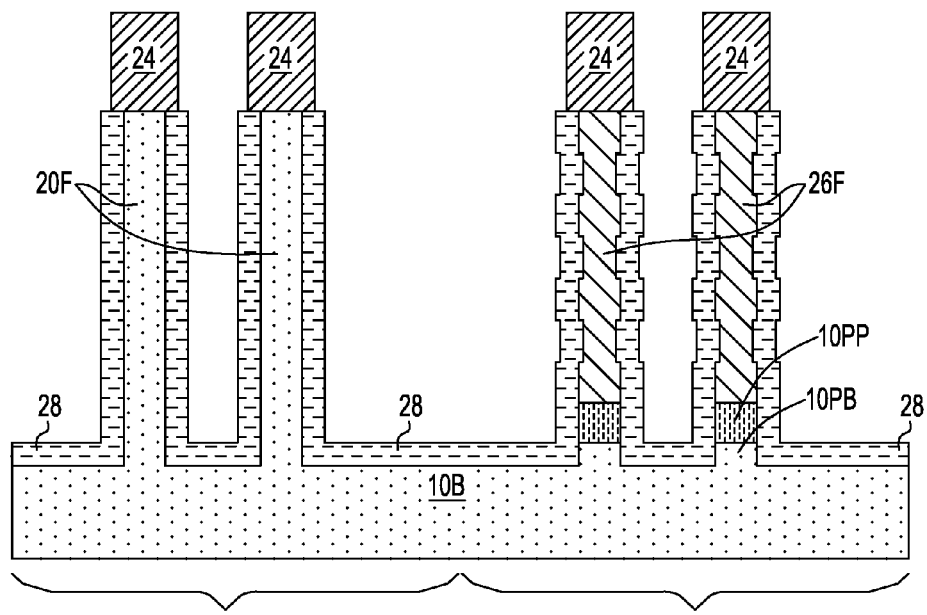
FIG. 6 is a cross sectional view of the exemplary semiconductor structure of FIG. 5 after performing a thermal oxidation process to convert each silicon fin precursor in the nFET device into a silicon fin and to convert each silicon germanium alloy fin precursor in the pFET device region into a silicon germanium alloy fin having a second germanium content that is greater than the first germanium content.

Referring now to FIG. 6, there is illustrated the exemplary semiconductor structure of FIG. 5 after performing a thermal oxidation process to convert each silicon fin precursor 20 in the nFET device region 100 into a silicon fin 20F and to convert each silicon germanium alloy fin precursor 26 in the pFET device region 102 into a silicon germanium alloy fin 26F having a second germanium content that is greater than the first germanium content. Also, an oxide layer 28 forms on all exposed semiconductor surfaces during the thermal oxidation process.

After oxidation, each silicon fin 20F that is formed has a second width that is less than the first width. Also, and after thermal oxidation, each silicon germanium alloy fin 26F that is formed has a second width that is less than the first width. In addition to thinning the silicon and silicon germanium alloy fin precursors (20, 26), the thermal oxidation also consumes an upper portion of the remaining silicon base layer 10B such that a silicon pedestal base 10PB is formed beneath the silicon pedestal portion 10PP. Collectively, elements 10PP and 10PB form a silicon pedestal structure of the present application; in some embodiments, in which the silicon pedestal 10P was entirely consumed, no silicon pedestal portion 10PP is present. In embodiments in which the fin precursors extend upward from a surface of an insulator layer, silicon pedestal base 10PB is not formed.

The thermal oxidation can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The oxidation process can be performed at a temperature from 400° C. to 1300° C. The oxidation process may include a furnace anneal, a rapid thermal anneal or any other anneal that can convert the fin precursors (20, 26) into the final fin structures (20F, 26F). During the thermal oxidation the sidewall roughness of the silicon germanium alloy fin precursor 26 is reduced and is now suitable for use as a fin structure.

Notably, FIG. 6, without the oxide layer 28 and hard mask cap 24, illustrates a semiconductor structure of the present application. Notably, there is shown a silicon fin 20F located directly on a first portion of a substrate (i.e., the remaining portion of the silicon base layer, i.e. element 10B), and a silicon germanium alloy fin 26F located directly on a silicon pedestal structure (10PP, 10PB) that is present directly on a second portion of the substrate (i.e., element 10B). In accordance with the present application, the silicon fin 20F and the silicon germanium alloy fin 26F have a same width and topmost surfaces that are coplanar with each other.

Figure 7:
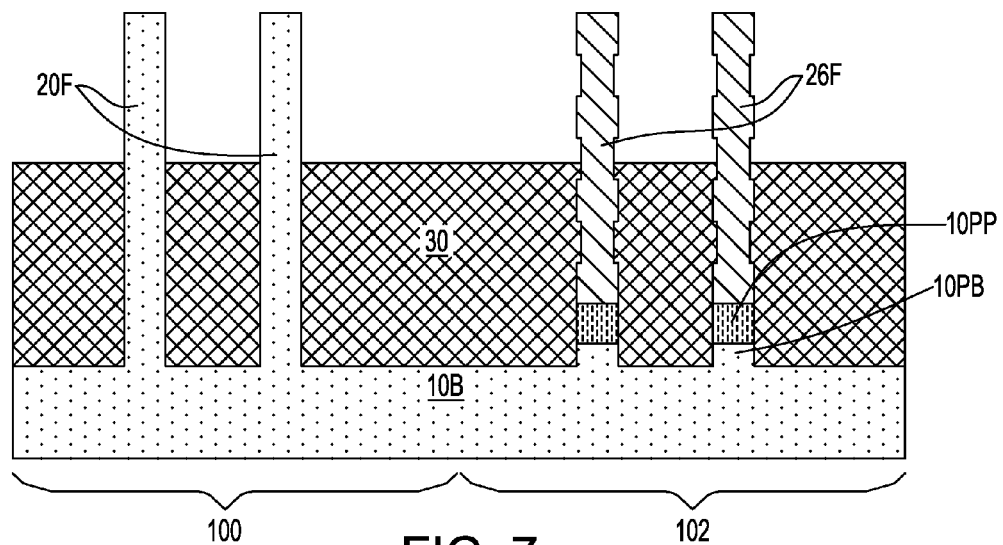
FIG. 7 is a cross sectional view of the exemplary semiconductor structure of FIG. 6 after forming a local isolation structure at the footprint of each silicon fin and each silicon germanium alloy fin having the second germanium content.

Referring now to FIG. 7, there is illustrated the exemplary semiconductor structure of FIG. 6 after forming a local isolation structure 30 at the footprint of each silicon fin 20F and each silicon germanium alloy fin 26F having the second germanium content. In some embodiments, and prior to forming each local isolation structure 30, oxide layer 28 can be removed from the exemplary semiconductor structure utilizing an etching process that is selective in removing the oxide layer 28. In other embodiments, the oxide layer 28 remains and an upper portion of the oxide layer 28 is removed from the sidewalls of each silicon fin 20F and each silicon germanium alloy fin 26F. In some embodiments, the formation of local isolation structures 30 can be omitted.

When formed, each local isolation structure 30 can be formed by deposition of a trench dielectric material such as, a trench dielectric oxide, and thereafter planarization and/or a recess etch may optionally be used to provide the local isolation structure 30. The planarization process may remove the hard mask cap 24 from atop each fin (20F, 26F). In some embodiments and if a planarization process is not used in forming the local isolation structures 30, each hard mask cap 24 can be removed after forming the local isolation structure 30 by a planarization process. In some embodiments, the hard mask cap 24 may remain on each silicon fin 20F and/or each silicon germanium alloy fin 26F throughout the remaining processing steps of the present application.

As is shown, the height of each local isolation structure 30 is less than the height of each fin (20F, 26F) such that upper sidewall surfaces and a topmost surface of each fin (20F, 26F) are exposed. The height of the local isolation structure 30 may vary so long as the height is sufficient enough to cover the silicon pedestal portion 10PP and the silicon pedestal base 10PB of each silicon germanium alloy fin 26F.

Figure 8:
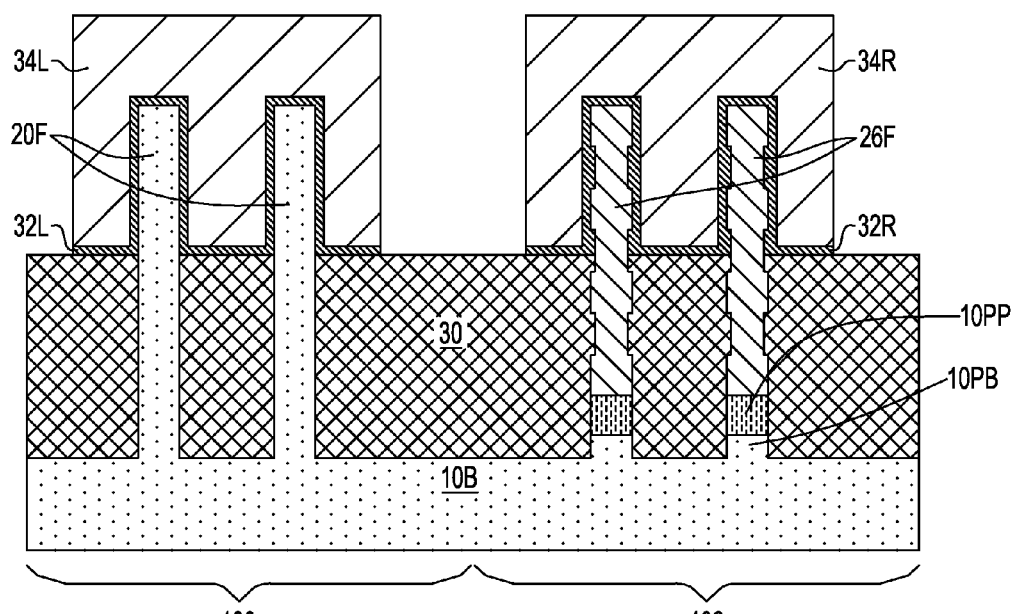
FIG. 8 is a cross sectional view of the exemplary semiconductor structure after forming a first functional gate structure straddling over each silicon fin, and a second functional gate structure straddling over each silicon germanium alloy fin having the second germanium content.

Referring now to FIG. 8, there is illustrated the exemplary semiconductor structure after forming a first functional gate structure (32L, 34L) straddling over each silicon fin 20F, and a second functional gate structure (32R, 34R) straddling over each silicon germanium alloy fin 26F. By "straddling over", it is meant that one part of the functional gate structure is located on one side of each fin within a particular device region, and another part of the functional gate structure is located on another side of each fin within the same device region. By "functional gate structure" it is meant a permanent gate structure used to control output current (i.e., flow of carriers in the channel) of a semiconducting device through electrical or magnetic fields.

The first functional gate structure that is formed includes a first gate material stack of, from bottom to top, a first gate dielectric portion 32L and a first gate conductor portion 34L. An optional first gate cap portion (not shown) may be present atop the first gate conductor portion 34L. Although a single first functional gate structure is described and illustrated, a plurality of a first functional gate structures can be formed. The second functional gate structure that is formed includes a second gate material stack of, from bottom to top, a second gate dielectric portion 32R and a second gate conductor portion 34R. An optional second gate cap portion (not shown) may be present atop the second gate conductor portion 34R. Although a single second functional gate structure is described and illustrated, a plurality of a second functional gate structures can be formed.

Each gate dielectric portion (32L, 32R) comprises a gate dielectric material. The gate dielectric material that provides each gate dielectric portion (32L, 32R) can be an oxide, nitride, and/or oxynitride. In one example, the gate dielectric material that provides each gate dielectric portion (32L, 32R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion (32L, 32R). In some embodiments, the first gate dielectric portion 32L comprises a same gate dielectric material as the second gate dielectric portion 32R. In other embodiments, the first gate dielectric portion 32L comprises a different gate dielectric material than the second gate dielectric portion 32R.

The gate dielectric material used in providing each gate dielectric portion (32L, 32R) can be formed by any deposition process including, for example, chemical vapor deposition (CVD), plasma enhanced chemical vapor deposition (PECVD), physical vapor deposition (PVD), sputtering, or atomic layer deposition. When different gate dielectric materials are used in providing the first and second gate dielectric portions (32L, 32R), block mask technology may be used. In one embodiment of the present application, the gate dielectric material used in providing each gate dielectric portion (32L, 32R) can have a thickness in a range from 1 nm to 10 nm. Other thicknesses that are lesser than, or greater than, the aforementioned thickness range can also be employed for the gate dielectric material.

Each gate conductor portion (34L, 34R) comprises a gate conductor material. The gate conductor material used in providing each gate conductor portion (34L, 34R) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion (34L, 34R) may comprise a same gate conductor material. In other embodiments, the first gate conductor portion 34L comprises a different gate conductor material than the second gate conductor portion 34R. For example, first gate conductor portion 34L may comprise an nFET gate metal, and the second gate conductor portion 34R may comprise a pFET gate metal.

The gate conductor material used in providing each gate conductor portion (34L, 34R) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In some embodiments in which different gate conductor materials are formed, block mask technology can be used. In one embodiment, the gate conductor material used in providing each conductor portion (34L, 34R) has a thickness from 1 nm to 100 nm. Other thicknesses that are lesser than, or greater than, the aforementioned thickness range can also be employed for the gate conductor material used in providing each gate conductor portion (34L, 34R).

If present, each gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, first and second sacrificial gate structures are first provided instead of the first and second functional gate structures described above. In another embodiment, at least one functional gate structure can be first provided straddling one of the sets of fins (e.g., fins 20F), and at least one sacrificial gate structure can formed straddling another of the sets of the fins (e.g., fins 26F).

By "sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap materials mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of each fin (20F, 26F) that are not protected by the gate structure; the source/drain regions would by located within a plane that runs into and out of the drawing illustrated in FIG. 8. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   forming a silicon fin precursor in an nFET device region of a substrate, and a fin stack comprising alternating material portions, and, from bottom to top, of silicon and a silicon germanium alloy in a pFET device region of said substrate;
   performing a thermal anneal to convert said fin stack into a silicon germanium alloy fin precursor having a first germanium content; and
   performing a thermal oxidation to convert said silicon fin precursor into a silicon fin, and to convert said silicon germanium alloy fin precursor into a silicon germanium alloy fin having a second germanium content that is greater than said first germanium content, wherein said silicon fin has a width that is less than a width of said silicon fin precursor and said silicon germanium alloy fin has a width less than a width of said silicon germanium alloy fin precursor.

2. The method of claim 1, wherein said forming said silicon fin precursor and said fin stack comprises:
   providing a hard mask layer on a surface of a silicon base layer, said silicon base layer comprises at least a portion of said substrate;
   removing said hard mask layer and an upper portion of said silicon base layer from said pFET device region;
   forming a material stack comprising alternating layers, and from bottom to top, of a silicon germanium alloy material and a silicon material on an exposed sub-surface of said silicon base layer in said pFET device region; and
   patterning a portion of said remaining silicon base layer in said nFET device region and said material stack and a sub-surface portion of said silicon base layer in said pFET device region.

3. The method of claim 2, wherein said patterning comprises a sidewall image transfer process.

4. The method of claim 2, wherein said patterning said sub-surface portion of said silicon base layer within said pFET device region provides a silicon pedestal as a bottommost silicon material portion of said fin stack.

5. The method of claim 2, wherein said material stack is formed by epitaxial deposition of said layers of silicon germanium alloy material and said layers of silicon material.

6. The method of claim 2, wherein each layer of silicon germanium alloy material has a germanium content from 20 atomic percent to 80 atomic percent.

7. The method of claim 1, wherein each silicon germanium material portion of said fin stack has width that is less than a width of each silicon material portion of said fin stack.

8. The method of claim 1, wherein said performing said thermal anneal further forms a silicon pedestal portion beneath a bottommost surface of said silicon germanium alloy fin precursor.

9. The method of claim 1, wherein said thermal oxidation consumes portions of said substrate and forms an oxide layer on sidewalls of said silicon fin and said silicon germanium alloy fin.

10. The method of claim 1, wherein said thermal anneal is performed in an inert ambient and at a temperature from 800° C. to 1350° C.

11. The method of claim 1, wherein said thermal oxidation is performed in an oxidizing ambient and at a temperature from 400° C. to 1300° C.

12. The method of claim 11, wherein said oxidizing ambient further comprises an inert gas, said inert gas constitutes from 2 volume % to 95 volume % of said oxidizing ambient.

13. The method of claim 1, further comprising forming a local isolation structure on exposed surfaces of said substrate and at a footprint of said silicon fin and said silicon germanium alloy fin, wherein an upper sidewall surfaces and a topmost surface of said silicon fin and said silicon germanium alloy fin are exposed.

14. The method of claim 13, further comprising forming a first functional gate structure straddling over said silicon fin, and a second functional gate structure straddling over said silicon germanium alloy fin.

* * * * *